United States Patent [19]
Ishii et al.

[11] Patent Number: 4,569,123
[45] Date of Patent: Feb. 11, 1986

[54] METHOD OF MANUFACTURING A SEMICONDUCTOR DEVICE UTILIZING SIMULTANEOUS DIFFUSION FROM AN ION IMPLANTED POLYSILICON LAYER

[75] Inventors: Tetsuo Ishii, Fujisawa; Tatsuro Mitani, Tokyo, both of Japan

[73] Assignee: Kabushiki Kaisha Toshiba, Kawasaki, Japan

[21] Appl. No.: 648,367

[22] Filed: Sep. 7, 1984

[30] Foreign Application Priority Data

Sep. 9, 1983 [JP] Japan .................. 58-165260

[51] Int. Cl.⁴ .................. H01L 21/225; H01L 21/265
[52] U.S. Cl. .................. 29/578; 29/576 B;
29/590; 29/591; 148/1.5; 148/174; 148/188;
148/190; 148/DIG. 106; 148/DIG. 123;
148/DIG. 124; 148/DIG. 151; 357/59
[58] Field of Search ............. 148/174, 188, 190, 1.5;
29/576 B, 578, 590, 591; 357/59

[56] References Cited

U.S. PATENT DOCUMENTS

| 3,719,535 | 3/1973 | Zoroglu | 148/188 X |
| 3,847,687 | 11/1974 | Davidsohn | 148/187 |
| 4,074,304 | 2/1978 | Shiba | 357/59 |
| 4,283,733 | 8/1981 | Aomura | 357/59 X |
| 4,357,622 | 11/1982 | Magdo et al. | 148/1.5 X |
| 4,375,999 | 3/1983 | Nawata et al. | 148/188 X |
| 4,407,060 | 10/1983 | Sakurai | 148/188 X |
| 4,465,528 | 8/1984 | Goto | 148/188 X |
| 4,497,106 | 2/1985 | Momma et al. | 29/578 X |

FOREIGN PATENT DOCUMENTS 58-16337 3/1983 Japan .

Primary Examiner—William G. Saba
Attorney, Agent, or Firm—Schwartz, Jeffery, Schwaab, Mack, Blumenthal & Evans

[57] ABSTRACT

A method for manufacturing semiconductor devices is presented. The method comprises the steps of opening two windows on an insulating layer covering a semiconductor substrate, and forming a polysilicon layer over the entire surface of the insulating layer and the windows. Donor and acceptor impurities are respectively implanted into the portions of the polysilicon layer corresponding to the two opening windows through the appropriate photoresists. The doped impurities are thereafter subjected to annealing to form two different conduction type regions under the two opening windows. Thereafter, a metal layer and a photoresist are deposited in order to make the metal electrodes for each conduction region. Thus, the patterning of the polysilicon can be made in self-alignment with the etching mask, and the formation of two different conduction type semiconductor regions are simultaneously attained.

4 Claims, 6 Drawing Figures

METHOD OF MANUFACTURING A SEMICONDUCTOR DEVICE UTILIZING SIMULTANEOUS DIFFUSION FROM AN ION IMPLANTED POLYSILICON LAYER

BACKGROUND OF THE INVENTION

The present invention relates to a method for manufacturing semiconductor devices, and more particularly it relates to a manufacturing method especially suitable for manufacturing very high frequency semiconductor devices.

Among the conventional methods for forming a pattern of polycrystalline silicon (hereinafter polysilicon) onto a semiconductor device, a method is known in which: a layer of polysilicon is formed on a device; a photoresist layer is formed on the polysilicon layer; and the polysilicon layer is selectively etched by using a mask of resist pattern formed by photolithography.

The above method has been used in manufacturing semiconductor devices comprising bipolar transistors or metal oxide semiconductor (MOS) transistors. The method known in the art, however, has the various problems mentioned hereunder, and therefore, it has not been suitable for manufacture of very large scaled integrated circuits (VLSI) or high frequency transistors particularly requiring an extra miniaturized structure.

That is, with this method, although the polysilicon layer is etched by using a mask of resist pattern, the resist itself is also corroded during etching the polysilicon layer. Therefore, the polysilicon layer can not be etched to have a definite width pattern as intended, and in many cases, the polysilicon layer has been excessively side-etched. In particular, when the polysilicon layer contains impurities such as phosphorus or arsenic at a high concentration level, an intimate contact between the polysilicon layer and the resist becomes worse. As a result, by patterning the polysilicon layer containing high concentrated impurities by using a mask of the resist pattern described above, the resultant polysilicon pattern is extremely thinned as from the predetermined dimension.

Thus, if the manufacture process of semiconductor devices includes an etching process for polysilicon, the configuration and dimension of the pattern of polysilicon after subjected to etching becomes to a large extent different from the dimensions and configuration of the designed mask, resulting in degrading the performance of semiconductor devices. For example, when doped polysilicon is used as a resistance or capacitance, the value of resistance or capacitance can not be controlled exactly because of the fact that the polysilicon can not be precisely etched.

Further, in the manufacture of devices, such as high frequency bipolar transistors, field effect transistors (FETs), or bipolar LSI and MOS LSI semiconductors, which require very fine miniaturized structures, if the etching dimension for the polysilicon is determined to have some margins or allowances in designing the mask, the degradation of device performance becomes of more increasing importance than the lowering of a yield. For example, in the manufacture of a very high frequency npn bipolar type silicon planar transistor, and in the formation of an electrode metal pattern on an arsenic (or phosphorus) doped polysilicon which is used as a diffusion source for an emitter, it is here assumed that the etching dimension is determined to have some margins in order to prevent exposure of an emitter diffusion window of an insulation layer due to a "thinning" caused during etching the polysilicon. Then, the distance between the edge of the polysilicon pattern and the base region increases, and the distance between the edges of the emitter region and the base region increases as well, so that the high frequency performance of the transistor is deteriorated.

In addition, in the case when an electrode metal pattern is formed on the doped polysilicon pattern with an extraordinary miniaturized structure, according to the conventional method since the doped polysilicon pattern and electrode metal pattern can not be formed at the same time with the same patterning process, a shear in alignment of both patterns comes into existence. As a result, for example, in the case of a very high frequency transistor, there causes a poor contact due to the shear between the polysilicon on the emitter and the base electrode. It has been impossible to narrow the distance between the edges of emitter and base regions more than a certain distance required for preventing such a poor contact. Therefore, with the conventional method, it has been impossible to improve the performance of a very high frequency transistor, and also to implement VLSI in a higher integration density.

Apart from the first method described above, in order to manufacture VLSI transistors or high frequency transistors, a second method is also known in the art which forms n+ and p+ regions in a silicon semiconductor body with a self-alignment technique (or without using a mask). In the second method, a resist pattern is formed which exposes opening portions of two openings provided on an oxide layer, donor and acceptor impurities are ion implanted into a silicon semiconductor substrate through the respective opening portions by using the resist pattern and oxide layer as a mask, and thereafter the substrate is subjected to annealing to form semiconductor regions opposite conductivity from each other in the substrate.

With the second method, however, though it is possible to design the dimension of a mask with some margins considering the side etching effect, the design with some margins makes the dimension of a single pellet large, thereby reducing the number of pellets obtainable from a single wafer and resulting in a low yield.

Further, with the second method, there have been brought about some problems including: (1) a channelling is liable to occur since the ion implantation is carried out directly into the silicon semiconductor substrate, (2) a device defect may easily appear on the surface of the silicon semiconductor substrate, and (3) in order to make the surface portion of the silicon semiconductor substrate at a high dopant concentration, the ion acceleration voltage must be lowered considerably. However, an ion implantation apparatus presently available has in effect a limit in the acceleration voltage so that it is difficult to make only the surface portion of the substrate at a high doping level.

Further in addition, when the second method is compared with, for example, a case in which ion doped polysilicon is employed as an emitter diffusion source and electrode, some other problems inappropriate for high frequency devices are found in that an emitter diffusion efficiency is worsened in proportion to an increase of an inverse current from the base, and in that a spiking phenomenon may appear in which aluminum of the emitter electrode diffuses during sintering abnormally into the silicon substrate and the emitter is shortcircuited to the base, thereby disabling to shallow the base-collector junction too much.

As a solution to the disadvantages of the first method, there has been proposed a method: in which one of main surfaces of a semiconductor substrate is covered with an insulating layer; a contact hole is opened on a definite position of the insulating layer; a polysilicon layer is deposited over the entire surface and impurities are diffused into the polysilicon layer; an interconnecting metal layer is further deposited onto the doped polysilicon layer; then the predetermined portion of the interconnecting metal layer is selectively removed; and the polysilicon layer is selectively removed using the selectively removed interconnecting metal layer as a mask. According to the above method, since the etching of the polysilicon layer is carried out by using the patterned interconnecting metal layer as a mask, and not by using a resist as a mask, the thinning of the polysilicon pattern can not occur. Moreover, with the same reason, the problem on the shear in alignment between the polysilicon and metal patterns can not occur. Also, since the doped polysilicon serves as a diffusion source, contact errors due to the shear in alignment between, for example, the polysilicon on the emitter and the base electrode can not occur, thereby enabling to make the edges of the emitter region and base region more closer in order to improve the high frequency performance.

The above proposed method, however, has many problems in forming both n+ and p+ regions in the silicon semiconductor substrate.

More in particular, in order to form both regions, first a resist pattern is formed which exposes a portion of the polysilicon layer under which a window portion is located, one of opposite conduction type regions being formed under the corresponding window portion. The impurities of the intended conductive type are injected into the exposed polysilicon layer, and the heating and diffusion processes are followed thereafter. Next, another resist pattern is formed which exposes a portion of the polysilicon layer under which a window portion is located, the other of opposite conduction type regions being formed under the corresponding window portion. The impurities of the intended conductive type opposite to that mentioned above are injected into the exposed polysilicon layer, and the heating and diffusion processes are followed. If n+ diffusion is first performed, the polysilicon layer injected with n type impurities such as phosphorus is twice subjected to thermal hysteresis including that in the following p+ diffusion. Thus, the diffusion area is broadened so that the base width in an npn transistor is narrowed to increase unnecessarily the current amplification ratio $h_{FE}$, and it is almost impossible to control the ratio. Conversely, if p+ diffusion is first performed, the following disadvantages are brought about. For example, in order to improve the high frequency performance of a very high frequency transistor, it is necessary to have a shallow junction and a high dopant concentration base contact portion. For example, the depth of base junction is 0.3 $\mu$m and the base surface concentration is in the order of $7 \times 10^{18}$ atoms/cm$^2$, and the p+ doping into the base contact portion is carried out at a high doping level in the order of $2 \times 10^{20}$ atoms/cm$^2$ at the surface concentration. In order to activate such high density doping region, for example, in the case of boron, a high temperature of 1000° C. is required so that, if the emitter diffusion is carried out prior to the p+ region diffusion, the previously formed base junction is unnecessarily made deeper to thereby deteriorate the high frequency performance.

Further, the mobility of the p type impurities in the polysilicon layer reaches about $2 \times 10^{-4}$ $\mu$m$^2$/sec, wherein the polysilicon layer has a layer thickness of 4000 Å and is formed by means of a low pressure chemical vapor deposition (LPCVD) method at a temperature of 625° C. and under a growing speed of 100 Å/min, and wherein the doping level of boron is $2 \times 10^{20}$ atoms/cm$^3$ and the heating process is carried out at 1000° C. The mobility of the p type impurities is larger than that of the n type impurities such as phosphorus and arsenic, respectively having in the order of $2 \times 10^{-5}$ $\mu$m$^2$/sec and $1 \times 10^{-5}$ $\mu$m$^2$/sec. Thus, in npn transistors, emitter diffusion about 10 minutes under 1000° C. causes boron in the polysilicon to diffuse about 0.5 $\mu$m, and annealing and diffusion of the p+ region under the like conditions prior to the emitter diffusion causes boron to move in total about 1 $\mu$m. When the boron moves and reaches the polysilicon region ion-implanted with n+ impurities, boron ion first diffuses into the substrate and a leakage is likely to occur. That is, the inverse breakdown voltage between emitter and base is lowered due to high density boron ion, thus causing extreme disadvantages in the usage of transistors and changes of $h_{FE}$.

In addition, the shorter the distance between windows formed in the insulating layer for forming emitter and base regions, the smaller the junction capacitance of the base. The high frequency performance can be expected to be improved with a smaller capacitance, and the distance can be shortened up to about 1 $\mu$m in proportion to the improvement of the mask dimension accuracy. However, with the above method, such a minute configuration can not be obtained.

SUMMARY OF THE INVENTION

It is therefore an object of the present invention to provide a method for manufacturing semiconductor devices which makes it possible to realize a high density device by etching a polysilicon layer precisely in accordance with designed dimensions.

It is another object of the present invention to provide a method for manufacturing semiconductor devices which makes it possible to improve the high frequency performance.

It is a further object of the present invention to provide a method for manufacturing semiconductor devices with a good manufacturing efficiency.

The above objects can be attained by the present invention described hereinunder. That is, the present invention includes the steps of:

opening first and second windows, through which two regions different in conductivity type are formed in the same element, in an insulating layer covering a silicon semiconductor substrate;

forming a polysilicon layer over the surface of the insulating layer located over at least said two regions;

ion implanting donor impurities on the portion of the polysilicon layer positioning over the first window by using a first mask pattern;

ion implanting acceptor impurities on the other portion of the polysilicon layer positioning over the second window by using a second mask pattern;

forming first and second regions different in conductivity type in the semiconductor substrate, by simultaneously diffusing under heat treatment ions injected into the polysilicon layer into the semiconductor substrate below the first and second windows;

forming at least one or more of metal layers upon the polysilicon layer;

selectively forming a metal pattern having portions laid over said first and second regions; and forming a polysilicon pattern electrically connected to the first and second regions and aligning with the metal pattern.

The present invention can fully be understood from the preferred embodiment shown in detail in the following drawings, in which:

FIGS. 1 to 6 are cross-sectional views of a semiconductor device in each step of the method according to the embodiment of the present invention.

DETAILED DESCRIPTION OF THE EMBODIMENT

Figure 1:
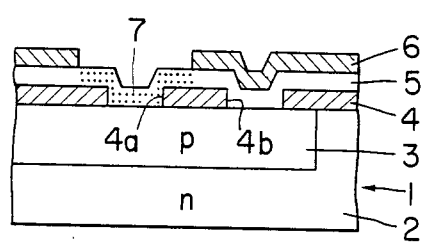

One of the embodiments of the method according to the present invention will now be described with reference to FIGS. 1 to 6. In the embodiment, the present invention is applied to a method for manufacturing a very high frequency npn silicon planar transistor. However, it is apparent that the present invention can be applied not only to the manufacture of bipolar elements but also to MOS FETs.

In the first step illustrated in the embodiment, a semiconductor substrate 1 already formed with a collector layer 2 of n type semiconductor and a base layer 3 of p type semiconductor, is formed with an insulating layer 4 on the surface thereof. Thereafter, two opening portions 4a and 4b for exposure of the base layer 3 are formed in the insulating layer 4. The opening portion 4a serves as an emitter window, and the opening portion 4b serves as a base window. In this embodiment, the distance between both opening portions was set at about 1.5 to 2 μm.

Next, a polysilicon layer 5 having a thickness of about 3000 to 5000 Å is deposited upon the opening portions and upon the insulating layer 4, and a resist layer is formed thereupon. The resist layer is patterned to form a resist pattern 6 from which the resist layer over the opening portion 4a has been removed. Donor (n) impurities such as arsenic or phosphorus are ion implanted into the polysilicon layer 5 exposing through an opening in the resist pattern 6. The finished device section is shown in FIG. 1.

Figure 2:
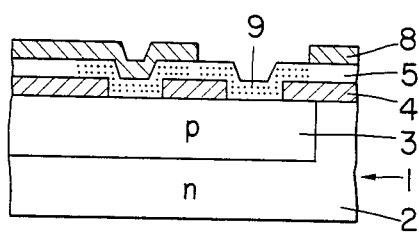

After the removal of the resist pattern 6, a new resist layer is formed upon the polysilicon layer 5. The resist layer is patterned to form a resist pattern 8 having an opening over the opening portion 4b. Acceptor (p) impurities such as boron are ion implanted into the polysilicon layer 5 exposing through the opening of the resist pattern 8. FIG. 2 is a cross-sectional view of the device after finishing the above processes.

Figure 3:
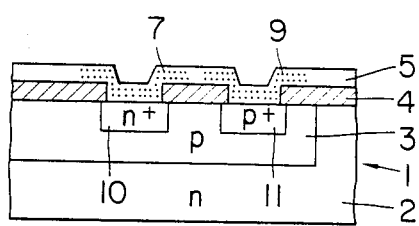
Figure 6:
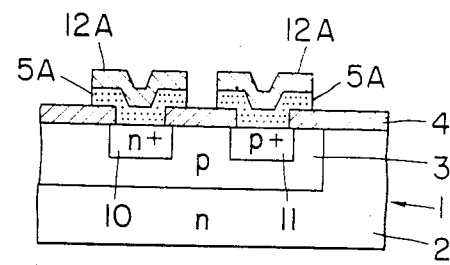

After removing the resist pattern 8, the semiconductor substrate 1 is subjected to heating at a predetermined temperature, such as 1000° C. The donor impurities 7 and acceptor impurities 9 in the polysilicon layer 5 are diffused into the base region 3 in the semiconductor substrate 1 to form an emitter region 10 and a high concentrated base region 11 (FIG. 3).

In the diffusion of the donor impurities 7 and acceptor impurities 9, these impurities are diffused not only into the base region 3 but also into the polysilicon layer 5. Since the heating process occurs only once, the moving distance of the impurities is in the order of 0.5 μm in the case of the acceptor impurities which are easier to diffuse. Thus, no adverse effects upon the different conductive type region can not exist.

Figure 4:
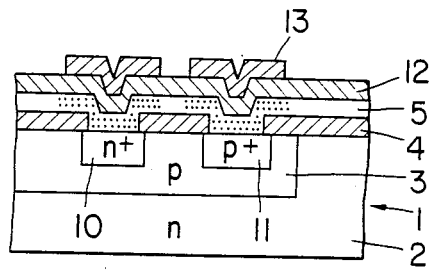

Upon completion of the diffusion process, a metal layer 12 having a thickness of 1 μm is evaporated upon the polysilicon layer 5, as shown in FIG. 4. Further, a resist pattern 13 is formed upon the metal layer 12 in a similar manner as above. The resist pattern 13 is positioned above the emitter region 10 and high concentration base region 11.

Figure 5:
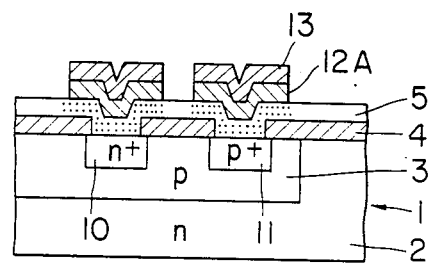

Next, the metal layer 12 is etched and patterned by using the resist pattern 13 as a mask, and a metal pattern 12A as shown in FIG. 5 is formed in self-alignment with the resist pattern 13.

Lastly, the resist pattern 13 is removed, and the polysilicon layer 5 is etched and patterned by using the metal pattern 12A as a mask. That is, the part of the polysilicon layer which is situated over the portion of the substrate between the emitter region and the base region and in which both acceptor and donor impurities are diffused is removed. Thus, a polysilicon pattern 5A is formed over the emitter region 10 and high concentration base region 11, the polysilicon pattern 5A aligning with the metal pattern 12A (refer to FIG. 6).

Materials and methods of forming such materials described in the above steps are not intended to limit thereto, but various materials and methods can be employed. For example, material for the metal layer 12 can be Ti—Pt—Au alloy or other metals other than aluminum as above. Further, the etching method of the metal layer 12 can be a lift-off method other than a conventional wet etching method. Furthermore, the method for etching the polysilicon layer 5 can include a plasma etching method or reactive ion etching (RIE) method.

In the above embodiment, in order to pattern the polysilicon layer 5, only the method in which the electrode metal pattern 12A is used as a mask, has been described. However, the polysilicon layer 5 can be patterned by using a laminate of the resist pattern 13 and metal pattern 12A.

Further, in addition, the above embodiment has been described in association with a very high frequency silicon diffusion type transistor element, however, the present invention can also be applied to such as a junction type field effect transistor element.

As seen from the above described embodiment, various advantages can be obtained from the method according to the present invention, which are in the following: (1) It is possible to form a polysilicon pattern aligning with the dimension and configuration of the mask, and also possible to form at the same time different conduction type regions. Therefore, it is not necessary to prepare the allowance or margins in designing the mask, which makes it possible to shorten the distance between the different conduction type regions so that the semiconductor elements can be made of a high density and the semiconductor performance can be improved. (2) The number of steps in resist pattern forming process and heating process for diffusion purpose is reduced by one when compared with the conventional processes. Thus, the process is shortened. (3) In the conventional methods, where ion implantation is carried out directly into the semiconductor substrate by means of an ion implantation apparatus, there have been a number of problems such as: a lattice defect is likely to occur at the substrate surface; the channelling phenomenon is likely to occur; it is difficult to form a shallow junction; and it is impossible to make the substrate surface of a high concentration. However, according to the present invention, since the doped polysilicon is used as a solid diffusion source, the above conventional problems accompanying the conventional method have been eliminated.

What is claimed is:

1. A method for manufacturing semiconductor devices comprising the steps of:

opening first and second windows, through which two regions different in conductivity type are formed in the same element, in an insulating layer covering a silicon semiconductor substrate;

forming a polysilicon layer over the surface of said insulating layer located over at least said two regions;

ion implanting donor impurities on the portion of said polysilicon layer positioning over said first window by using a second mask pattern;

forming first and second regions different in conductiveity type in said semiconductor substrate, by simultaneously diffusing under heat treatment ions injected into said polysilicon layer into said semiconductor substrate below said first and second windows;

forming at least one or more of metal layers upon said polysilicon layer;

selectively removing that part of the metal layer or layers which are situated over that part of the polysilicon layer situated over the portion of the substrate between the first and the second regions to form a metal pattern; and removing that part of the polysilicon layer situated over the portion of the substrate between the first and second regions to form a polysilicon pattern electrically connected to said first and second regions using the metal pattern as a mask.

2. A method for manufacturing semiconductor devices according to claim 1, in which said semiconductor devices include an npn transistor, said first region is an emitter, and said second region is a base.

3. A method for manufacturing semiconductor devices according to claim 2, in which said emitter is formed by diffusing donor impurities of phosphorus or arsenic, and said base is formed by diffusing acceptor impurities of boron.

4. A method for manufacturing semiconductor devices according to claim 1, in which the distance between said first and second windows are about 1 $\mu$m.

* * * * *